(12) United States Patent
Frazier

(10) Patent No.: US 6,441,767 B1
(45) Date of Patent: Aug. 27, 2002

(54) METHOD AND SYSTEM FOR ADJUSTING A THRESHOLD CONTROL IN AN ANALOG-TO-DIGITAL CONVERTER

(75) Inventor: Gary A. Frazier, Garland, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/727,312

(22) Filed: Nov. 29, 2000

(51) Int. Cl.$^7$ ................................................ H03M 1/12
(52) U.S. Cl. ........................................ 341/155; 341/166
(58) Field of Search ................................. 341/155, 143, 341/118, 120; 375/316

(56) References Cited

U.S. PATENT DOCUMENTS

| | | | |
|---|---|---|---|
| 4,876,544 A | * 10/1989 | Kuraishi | 341/166 |
| 5,073,777 A | 12/1991 | Fukuhara et al. | 341/131 |
| 5,283,583 A | 2/1994 | Ichihara | 341/162 |
| 5,363,101 A | 11/1994 | Ueki | 341/143 |
| 5,392,039 A | * 2/1995 | Thurston | 341/143 |
| 5,528,239 A | 6/1996 | Swanson et al. | 341/143 |
| 5,550,872 A | 8/1996 | Liberti, Jr. et al. | 375/347 |
| 5,579,247 A | 11/1996 | Kerth et al. | 364/571.02 |
| 5,629,700 A | 5/1997 | Kumamoto et al. | 341/161 |
| 5,774,008 A | 6/1998 | Shou et al. | 327/361 |
| 5,835,044 A | 11/1998 | Nishino | 341/143 |
| 5,852,374 A | 12/1998 | Frazier | 327/77 |
| 5,898,395 A | * 4/1999 | Werrbach et al. | 341/118 |
| 5,986,605 A | 11/1999 | Priebe et al. | 342/427 |
| 6,014,570 A | 1/2000 | Wong et al. | 455/500 |
| 6,087,986 A | 7/2000 | Shoki et al. | 342/383 |
| 6,094,173 A | 7/2000 | Nylander | 343/742 |
| 6,166,690 A | 12/2000 | Lin et al. | 342/383 |
| 6,275,540 B1 | * 8/2001 | Barrett, Jr. et al. | 375/316 |

OTHER PUBLICATIONS

Seitzer et al., Electronic Analog–to–Digital Converters, pp. 84–85.
Frerking, Digital Signal Processing in Comunication Systems, pp. 495–496.

* cited by examiner

*Primary Examiner*—Peguy JeanPierre
*Assistant Examiner*—Joseph Lauture
(74) *Attorney, Agent, or Firm*—Baker Botts L.L.P.

(57) ABSTRACT

In one aspect of the invention, a method for sampling an input signal includes offsetting the input signal with a reference signal. The reference signal represents an offset voltage in the analog-to-digital converter. The method also includes generating a digital output signal based on the offset input signal. The method further includes adjusting the reference signal based on the digital output signal. In addition, the method includes communicating the adjusted reference signal for further offsetting of the input signal.

20 Claims, 3 Drawing Sheets

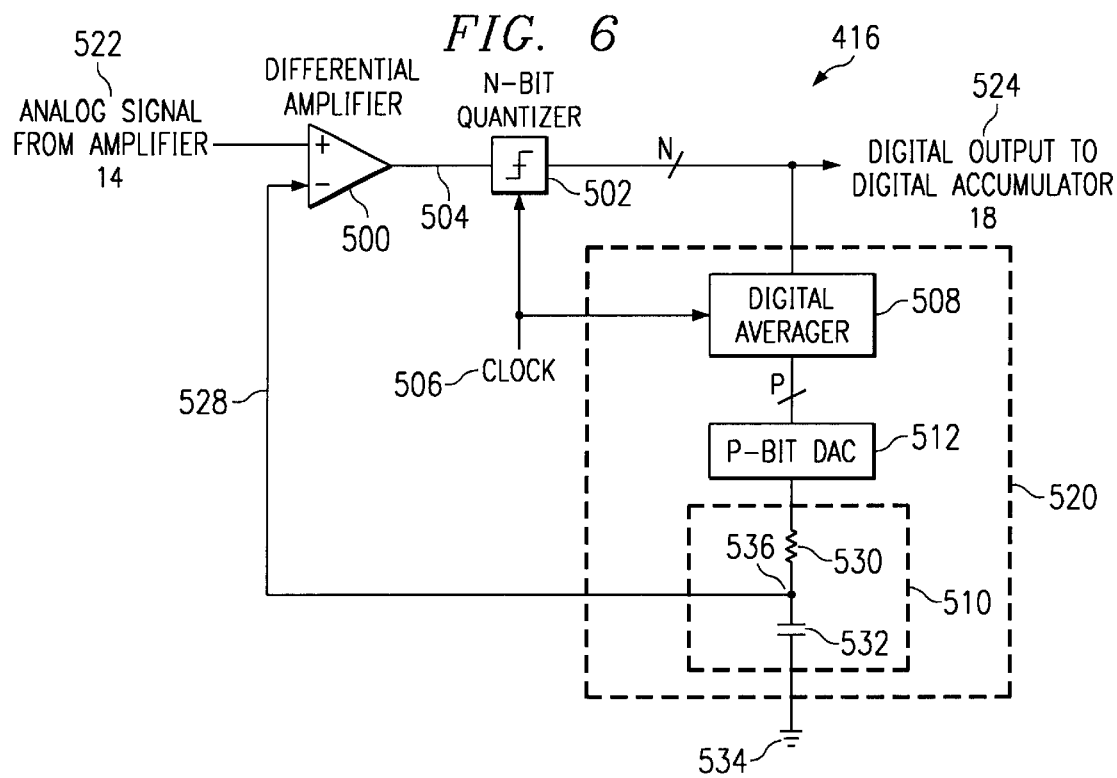

METHOD AND SYSTEM FOR ADJUSTING A THRESHOLD CONTROL IN AN ANALOG-TO-DIGITAL CONVERTER

GOVERNMENT LICENSE RIGHTS

This invention was made with U.S. Government support. The U.S. Government has certain rights in the invention.

TECHNICAL FIELD OF THE INVENTION

This invention relates generally to data processing, and more particularly to a method and system for adjusting a threshold control in an analog-to-digital converter.

BACKGROUND OF THE INVENTION

Communication systems often use analog-to-digital converters to sample analog input signals. The analog signals may contain information that will be processed by the communication system. Typically, the analog-to-digital converter receives the analog signal, samples the analog signal at different times, and generates digital representations of the analog signal at those times. Those digital representations form a digital output signal that represents the analog input signal. A processor or other computing device in the communication system uses the digital output signal to approximate the analog signal.

Many types and styles of analog-to-digital converters have been developed. Low-resolution analog-to-digital converters typically sample an analog input signal and generate digital values having one or several bits. In order to use low-resolution analog-to-digital converters in antennas and other components of the communication system, the analog-to-digital converters typically need to maintain a high level of sensitivity.

One problem with conventional analog-to-digital converters is that they often suffer from the formation of direct current (DC) offset voltages within the converters. These offset voltages interfere with the quantization of an analog input signal. For example, if the offset voltage is greater than the voltage of the analog input signal, the analog-to-digital converter would generate the same digital output value, no matter how the analog input signal varies. The converter is unable to quantize analog signals that fall below the offset voltage, and the communication system cannot process the input signal. As a result, maintaining a high level of sensitivity is often difficult when an offset voltage forms in the analog-to-digital converters.

Another problem with conventional analog-to-digital converters is that the decrease in sensitivity also decreases the range of the converters. As the distance between the analog-to-digital converters and a source of the analog input signal increases, the strength of the analog signal decreases. Because conventional analog-to-digital converters often suffer from the formation of offset voltages, the offset voltage eventually becomes greater than the analog input signal. The converters are unable to quantize analog signals that fall below the offset voltage, which limits the effective range of the converters.

In addition, the decrease in sensitivity reduces the signal-to-noise power ratio of the converters. The signal-to-noise power ratio represents the power of the useful information generated by a converter compared to the power of the noise or undesired signals generated by the converter. Because the formation of offset voltages reduces the sensitivity of the converters, the converters generate more noise or undesired signals in the digital output signals. This reduces the effectiveness of the communication system and typically requires additional equipment in the system to remove the noise from the digital signal.

Reducing or eliminating the offset voltage in an analog-to-digital converter is often difficult because the offset voltage routinely changes. The offset voltage that forms in an analog-to-digital converter may change, for example, over time. The offset voltage may also change based on variations in the temperature of the analog-to-digital converter and variations in the manufacturing process used to fabricate the analog-to-digital converter.

SUMMARY OF THE INVENTION

The present invention recognizes a need for an improved method and system for adjusting a threshold control in an analog-to-digital converter. The present invention reduces or eliminates at least some of the shortcomings of prior systems and methods.

In one embodiment of the invention, a method for sampling an input signal includes offsetting the input signal with a reference signal. The reference signal represents an offset voltage in the analog-to-digital converter. The method also includes generating a digital output signal based on the offset input signal. The method further includes adjusting the reference signal based on the digital output signal. In addition, the method includes communicating the adjusted reference signal for further offsetting of the input signal.

In another embodiment of the invention, an analog-to-digital converter for sampling an input signal includes a differential amplifier operable to receive the input signal and a reference signal and to offset the input signal with the reference signal. The reference signal represents an offset voltage in the analog-to-digital converter. The analog-to-digital converter also includes a quantizer coupled to the differential amplifier. The quantizer is operable to receive the offset input signal and to generate a digital output signal based on the offset input signal. In addition, the analog-to-digital converter includes a feedback element coupled to the quantizer and to the differential amplifier. The feedback element is operable to adjust the reference signal based on the digital output signal and to communicate the adjusted reference signal to the differential amplifier.

Numerous technical advantages can be gained through various embodiments of the invention. Various embodiments of the invention may exhibit none, some, or all of the following advantages. For example, in one embodiment of the invention, an analog-to-digital converter is provided that may maintain a high level of sensitivity. For example, the analog-to-digital converter may include a feedback element. The feedback element generates a reference signal based on the digital output signal produced by the converter. Because the input signal sampled by the analog-to-digital converter is usually sinusoidal, the converter should produce an equal or near equal number of high and low digital values over time. If the converter produces more high or more low digital values, an offset voltage may be forming in the analog-to-digital converter. The feedback element adjusts the reference signal, and the analog-to-digital converter uses the adjusted reference signal to generate additional digital values. This allows the analog-to-digital converter to adjust the reference signal and to maintain a high level of sensitivity. The high level of sensitivity also helps to maintain a high level of sensitivity in the entire communication system.

Another advantage of some embodiments of the invention is that the analog-to-digital converter may have a greater range than conventional analog-to-digital converters. By reducing or eliminating the effects of an offset voltage in the converter, the converter may quantize input signals at a greater distance from the source of the input signals. As a result, the effective range of the converters increases.

A further advantage of some embodiments of the invention is that the analog-to-digital converter has an improved signal-to-noise power ratio. The analog-to-digital converter generates more useful information compared to the amount of noise or undesired signals generated by the converter. This improves the effectiveness of the communication system and may reduce or eliminate the need for additional equipment to remove the noise from the digital output signal.

In addition, some embodiments of the invention may be less susceptible to variable offset voltages. For example, offset voltages in conventional converters typically vary over time, temperature, and/or fabrication methods. Some embodiments of the invention may reduce or eliminate the formation of offset voltages under these varying conditions. Because the feedback element adjusts the reference signal based on the output of the analog-to-digital converter, this provides a dynamic solution to the formation of offset voltages.

Other technical advantages are readily apparent to one of skill in the art from the attached figures, description, and claims.

BRIEF DESCRIPTION OF THE DRAWINGS

For a more complete understanding of the present invention and the advantages thereof, reference is now made to the following descriptions taken in connection with the accompanying drawings, in which:

FIG. 6 is a block diagram illustrating another exemplary multiple-bit analog-to-digital converter constructed according to the teachings of the present invention;

FIG. 7 is a block diagram illustrating another exemplary digital averager constructed according to the teachings of the present invention; and FIG. 8 is a flowchart illustrating an exemplary method for sampling an input signal according to the teachings of the present invention.

DETAILED DESCRIPTION OF THE INVENTION

Figure 1:
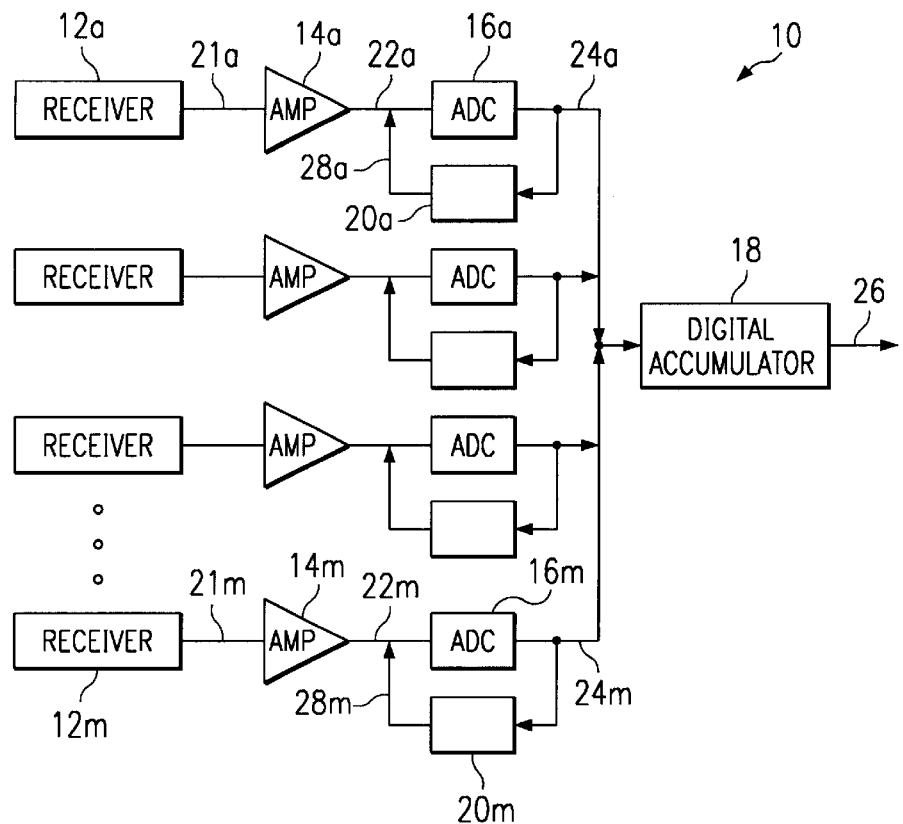
FIG. 1 is a block diagram illustrating an exemplary communication system constructed according to the teachings of the present invention.

FIG. 1 is a block diagram illustrating an exemplary communication system 10 constructed according to the teachings of the present invention. In the illustrated embodiment, system 10 includes a plurality of receivers 12a–12m, a plurality of amplifiers 14a–14m, a plurality of analog-to-digital converters (ADCs) 16a–16m, and a digital accumulator 18. Other embodiments of system 10 may be used without departing from the scope of the present invention.

In one aspect of operation, analog-to-digital converter 16 receives an input signal 22, offsets the input signal 22 with a reference signal 28, and generates a digital output signal 24 based on the offset input signal 22. The digital output signal 24 typically contains digital values representing the input signal 22. To maintain a high level of sensitivity, analog-to-digital converter 16 includes a feedback element 20, which generates the reference signal 28. The reference signal 28 may vary based on the digital output signal 24. For example, the reference signal 28 may vary based on the average of the digital values in the digital output signal 24. Because the input signal 22 received by analog-to-digital converter 16 is usually sinusoidal, the long-term average number of high and low digital values in the digital output signal 24 should be equal or near equal. When the number of high and low digital values are not equal or near equal, an offset voltage may be forming in analog-to-digital converter 16. Feedback element 20 adjusts the reference signal 28 based on the digital output signal 24, and analog-to-digital converter 16 uses the adjusted reference signal 28 to generate additional digital values in output signal 24. By allowing the reference signal 28 to adjust with the changing output of converter 16, the long-term numbers of high and low values in the digital output signal 24 produced by analog-to-digital converter 16 may remain equal or near equal. This helps to increase the sensitivity of analog-to-digital converter 16.

In the illustrated embodiment, each receiver 12 is coupled to an amplifier 14. In this document, the term "couple" refers to any direct or indirect communication between two or more elements, whether or not those elements are in physical contact with one another. Receiver 12 is operable to receive an input signal 21 and to communicate the input signal 21 to amplifier 14. In this document, the phrase "input signal" refers to any signal having an analog component. The input signal 21 may include signals that are purely analog in nature, such as radio frequency signals. The input signal 21 may also include signals having, for example, an analog component and a direct current (DC) offset. Receiver 12 may receive the input signal 21 over any suitable communication medium, such as a wireless or a wireline medium. For example, receiver 12 may receive the input signal 21 over a wireless interface or a fiber optic line. Receiver 12 may comprise any hardware, software, firmware, or combination thereof operable to receive input signals 21. In one embodiment, receiver 12 comprises a receiver element in an antenna, such as a phased array antenna.

Each amplifier 14 is coupled to a receiver 12 and an analog-to-digital converter 16. Amplifier 14 is operable to receive the input signal 21 from receiver 12 and to amplify the input signal 21. Amplifier 14 is also operable to communicate the amplified signal 22 to analog-to-digital converter 16. Amplifier 14 may comprise any hardware, software, firmware, or combination thereof operable to amplify input signals 21. In one embodiment, amplifier 14 comprises a low noise amplifier operable to amplify input signals 21 without adding excessive noise to the amplified signal 22. In another embodiment, system 10 may process input signals 21 without amplifying the signals 21.

Figure 2:
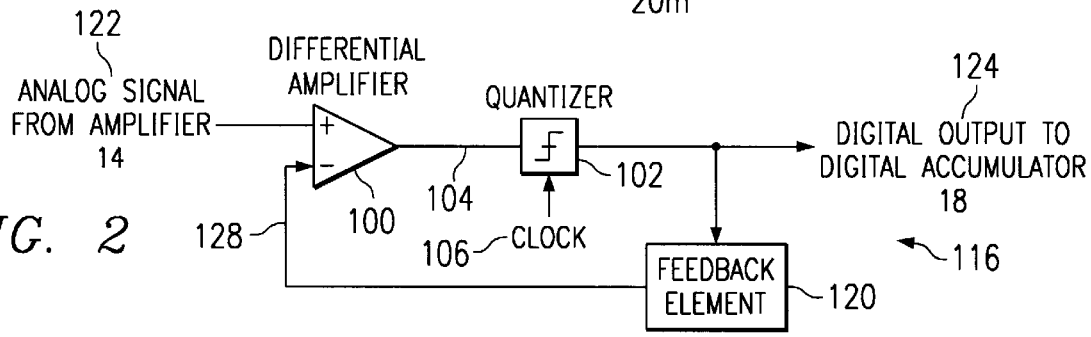
FIG. 2 is a block diagram illustrating an exemplary analog-to-digital converter constructed according to the teachings of the present invention.
Figure 3:
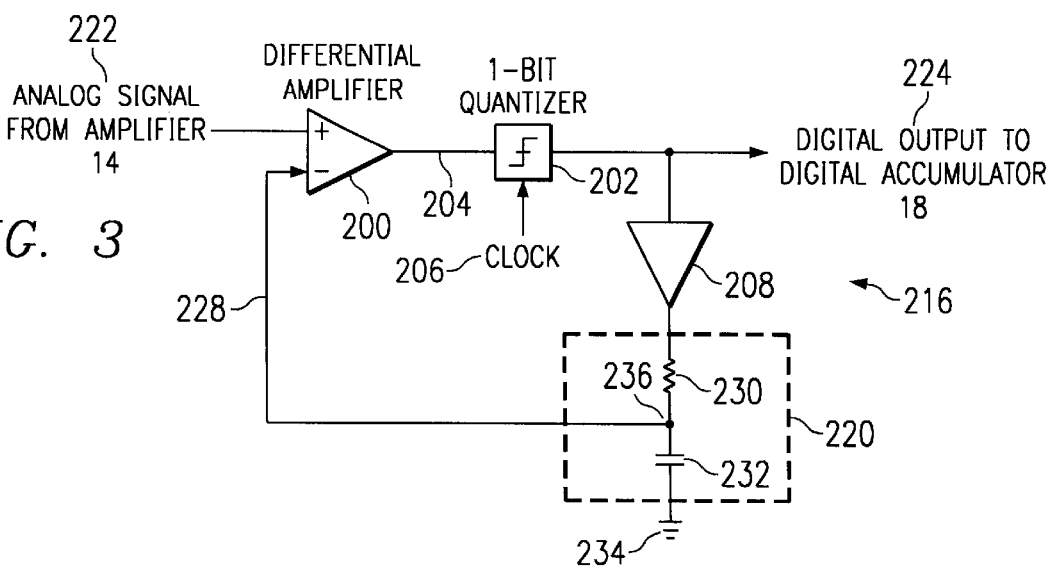
FIG. 3 is a block diagram illustrating an exemplary one-bit analog-to-digital converter constructed according to the teachings of the present invention.
Figure 4:
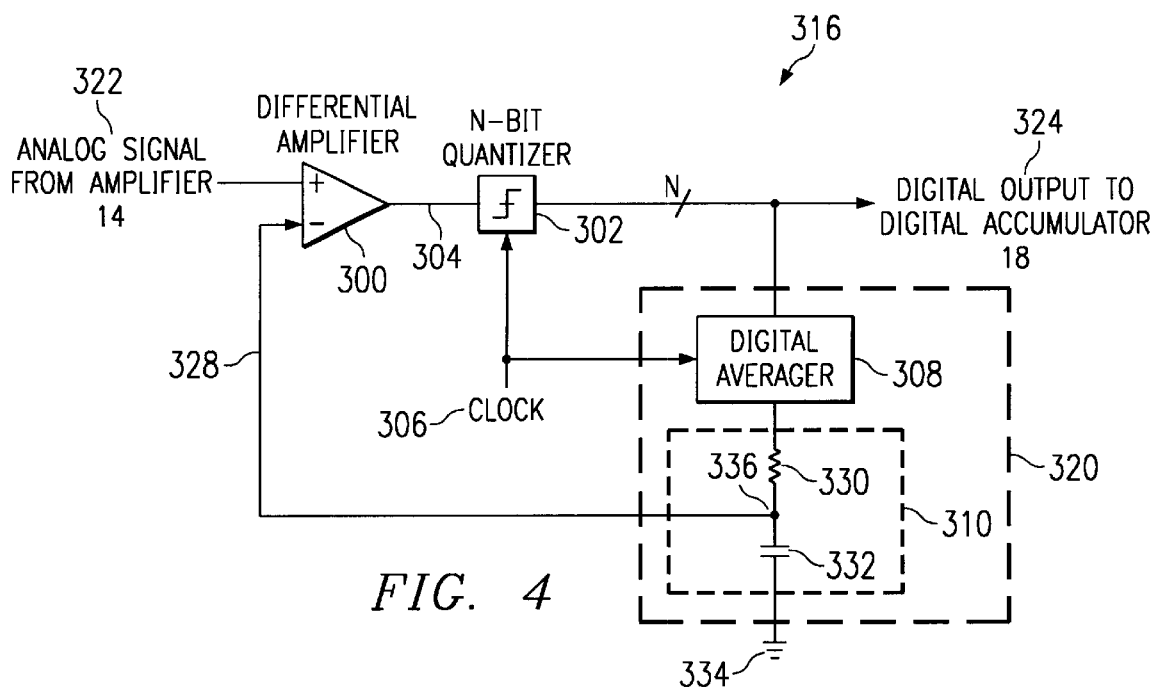
FIG. 4 is a block diagram illustrating an exemplary multiple-bit analog-to-digital converter constructed according to the teachings of the present invention.

Each analog-to-digital converter 16 is coupled to an amplifier 14 and to digital accumulator 18. Analog-to-digital converter 16 is operable to receive the amplified input signal 22 from amplifier 14. Analog-to-digital converter 16 is also operable to convert the input signal 22 into a digital output signal 24 that contains digital values representing the input signal 22. Analog-to-digital converter 16 is further operable to communicate the digital output signal 24 containing the digital values to digital accumulator 18. Analog-to-digital converter 16 may comprise any hardware, software, firmware, or combination thereof operable to convert input signals 22 into digital signals 24. Example embodiments of various analog-to-digital converters are shown in FIGS. 2–4, which are described below.

Digital accumulator 18 is coupled to analog-to-digital converters 16. Digital accumulator 18 receives the digital output signals 24 representing the input signals 22 from analog-to-digital converters 16. Digital accumulator 18 also sums the digital output signals 24 generated by analog-to-digital converters 16, generating a net digital output signal 26. Digital accumulator 18 may comprise any hardware, software, firmware, or combination thereof operable to sum digital signals 24. In one embodiment, digital accumulator 18 comprises a digital signal processor operable to sum the digital signals 24 from analog-to-digital converters 16. In a particular embodiment, digital accumulator 18 comprises a binary adder tree operable to sum a plurality of output signals 24 and generate a multiple-bit net output signal 26.

In one aspect of operation, one or more analog-to-digital converters 16 include feedback elements 20. The feedback element 20 produces a reference signal 28. In one embodiment, the reference signal 28 comprises a voltage signal that represents the average of the values in the digital output signal 24 generated by a converter 16. In this embodiment, feedback element 20 may have a time constant that filters information-carrying frequencies out of reference signal 28. The value of reference signal 28 represents the average value of the offset voltage in analog-to-digital converter 16, and analog-to-digital converter 16 may use reference signal 28 to reduce or eliminate the effects of the offset voltage.

In one embodiment, high digital values have a positive voltage and low digital values have a negative voltage. When the average number of high and low values in output signal 24 are equal, feedback element 20 generates a reference signal 28 of zero volts. When the average number of high and low values in output signal 24 are not equal, feedback element 20 generates a reference signal 28 having a positive or negative voltage. The reference signal 28 is then used to generate additional digital values in digital output signal 24. By allowing the reference signal 28 to adjust with the changing output signal 24 of converter 16, the average numbers of high and low values in the digital output signal 24 may remain equal or near equal. This helps to reduce or eliminate the formation of an offset voltage in analog-to-digital converter 16, which increases the sensitivity of analog-to-digital converter 16.

In addition, the source of the input signal 21 may also suffer from the formation of an offset voltage. Because of this, the input signal 21 generated by that source may cause an offset voltage to form in analog-to-digital converter 16. In some embodiments, the use of feedback element 20 may also improve communication between system 10 and the source of input signal 21 by reducing or eliminating the effects of the offset voltage in the source of input signal 21. As the analog-to-digital converter 16 processes input signal 21, the offset voltage in the source of input signal 21 may cause analog-to-digital converter 16 to produce greater numbers of high or low values in digital output signal 24. Feedback element 20 helps to reduce or eliminate the effects of the offset voltage in the source of input signal 21 by varying reference signal 28, which may help analog-to-digital converter 16 to process input signal 21 more accurately.

FIG. 2 is a block diagram illustrating an exemplary analog-to-digital converter 116 constructed according to the teachings of the present invention. Analog-to-digital converter 116 may be suitable for use in system 10 of FIG. 1. In the illustrated embodiment, analog-to-digital converter 116 includes a differential amplifier 100, a quantizer 102, and a feedback element 120. Other embodiments of analog-to-digital converter 116 may be used without departing from the scope of the present invention.

Differential amplifier 100 is coupled to quantizer 102 and feedback element 120. Differential amplifier 100 receives an input signal 122 from amplifier 14 at a first input. Differential amplifier 100 also receives a reference signal 128 from feedback element 120 at a second input. Reference signal 128 may, for example, comprise a voltage signal representing the average of the values in the digital output signal 124 produced by quantizer 102. Differential amplifier 100 offsets the input signal 122 with the reference signal 128 by subtracting the reference signal 128 from the input signal 122. In addition, differential amplifier 100 generates an output signal 104 and communicates the signal 104 to quantizer 102. In one embodiment, the output signal 104 of differential amplifier 100 has a value approximately equal to:

$$G*(V_{input} - V_{reference})$$

where $V_{input}$ represents the voltage of input signal 122, $V_{reference}$ represents the voltage of reference signal 128, and G represents the gain of differential amplifier 100.

The gain of differential amplifier 100 may be selected to provide any desired functionality in system 10. In one embodiment, differential amplifier 100 has a positive gain that is linear for both the direct current (DC) component of input signal 122 and for the frequency of the input signal 122. In a particular embodiment, differential amplifier 100 has a unity gain. In another particular embodiment, differential amplifier 100 has a gain defined by the formula:

$$F_{highest}/BW$$

where $F_{highest}$ represents the highest information-containing frequency in input signal 122, and BW represents the bandwidth of differential amplifier 100. Differential amplifier 100 may comprise any hardware, software, firmware, or combination thereof operable to generate an output signal 104 representing the difference between an input signal 122 and a reference signal 128.

Quantizer 102 is coupled to differential amplifier 100 and feedback element 120. Quantizer 102 is operable to receive the signal 104 generated by differential amplifier 100. Quantizer 102 is also operable to generate a digital output signal 124 using signal 104. For example, when signal 104 from differential amplifier 100 is positive, quantizer 102 may generate a high digital value in digital output signal 124. When signal 104 from differential amplifier 100 is negative, quantizer 102 may generate a low digital value in digital output signal 124. Quantizer 102 may generate digital values in digital output signal 124 under the control of a clock signal 106. Quantizer 102 may comprise any hardware, software, firmware, or combination thereof operable to receive and quantize a signal. In one embodiment, quantizer 102 comprises a latch.

Feedback element 120 is coupled to quantizer 102 and differential amplifier 100. Feedback element 120 receives the digital output signal 124 generated by quantizer 102. Based on the digital output signal 124, feedback element 120 generates a reference signal 128. Reference signal 128 may, for example, represent the average of the digital values in the digital output signal 124. In one embodiment, if digital output signal 124 contains more high values than low values, feedback element 120 may generate a positive reference signal 128. Likewise, if digital output signal 124 contains more low values than high values, feedback element 120 may generate a negative reference signal 128. When digital output signal 124 contains equal numbers of low and high values, feedback element 120 generates a reference signal 128 of zero volts. Feedback element 120 may comprise any hardware, software, firmware, or combination thereof operable to receive a digital output signal 124 and generate a reference signal 128 based on the digital output signal 124. In one embodiment, feedback element 120 comprises a filter, such as a low-pass filter. In another embodiment, feedback element 120 comprises a buffered integrator, such as a Miller integrator.

In one aspect of operation, feedback element 120 acts as a feedback loop in analog-to-digital converter 116. Because the input signal 122 from amplifier 14 is usually sinusoidal, the average number of high and low digital values in digital output signal 124 is usually equal or near equal. If the digital output signal 124 contains unequal numbers of low and high digital values, an offset voltage may be forming in analog-to-digital converter 116 and/or an offset voltage may have formed in the source of signal 122. To compensate for the offset voltage, feedback element 120 generates a positive or negative reference signal 128. The positive or negative reference signal 128 generated by feedback element 120 is communicated to differential amplifier 100, and differential amplifier 100 offsets the input signal 122 from amplifier 14 with the adjusted reference signal 128. By allowing the reference signal 128 used by differential amplifier 100 to vary according to the output signal 124 produced by quantizer 102, the average number of high and low digital values in digital output signal 124 may remain equal or near equal over time. This helps to reduce or eliminate the effects of an offset voltage in analog-to-digital converter 116, which improves the sensitivity of analog-to digital converter 16.

FIG. 3 is a block diagram illustrating an exemplary one-bit analog-to-digital converter 216 constructed according to the teachings of the present invention. Analog-to-digital converter 216 may be suitable for use in system 10 of FIG. 1. In the illustrated embodiment, analog-to-digital converter 216 includes a differential amplifier 200, a quantizer 202, a buffer 208, and a feedback element 220. Other embodiments of analog-to-digital converter 216 may be used without departing from the scope of the present invention.

Differential amplifier 200 may be the same or similar to differential amplifier 100 of FIG. 2. Quantizer 202 receives a signal 204 from differential amplifier 200. In one embodiment, when signal 204 from differential amplifier 200 is positive, quantizer 202 generates a one-bit digital value, represented by a high pulse, in digital output signal 224. When signal 204 from differential amplifier 200 is negative, quantizer 202 generates another one-bit digital value, represented by a low pulse, in digital output signal 224. Quantizer 202 may generate digital pulses in digital output signal 224 under the control of a clock signal 206.

In the illustrated embodiment, feedback element 220 comprises an RC network that includes a resistor 230 and a capacitor 232. Resistor 230 is coupled in series with capacitor 232, and capacitor 232 is further coupled to a ground 234. Feedback element 220 receives the digital output signal 224 generated by quantizer 202, and feedback element 220 generates a reference signal 228, such as a voltage signal representing an average of the digital values in the digital output signal 224. The reference signal 228 is produced at a point 236 between resistor 230 and capacitor 232.

Component values for resistor 230 and capacitor 232 may be selected to provide any desired functionality in analog-to-digital converter 216. In one embodiment, component values for resistor 230 and capacitor 232 are selected based on a desired time constant of feedback element 220. The time constant of feedback element 220 is typically defined using the formula:

Time constant=$RC$ where R represents the resistance of resistor 230 in Ohms and C represents the capacitance of capacitor 232 in Farads.

In one embodiment, the time constant of feedback element 220 may be approximately equal to the period of the offset "drift" within input signal 222 and/or within analog-to-digital converter 216. The period of the offset drift represents the rate at which an offset voltage varies or changes in the input signal 222 and/or analog-to-digital converter 216. In this embodiment, feedback element 220 adjusts reference signal 228 in the same order of time as the drift rate of the offset voltage within input signal 222 and/or analog-to-digital converter 216. In a particular embodiment, the time constant of feedback element 220 is long enough such that the value of reference signal 228 follows the temporal drift in the offset voltage of input signal 222 and/or analog-to-digital converter 216.

In another embodiment, input signal 222 carries information with a characteristic spectral bandwidth. For example, input signal 222 may carry multiple wireless telephone conversations, each spanning a unique range of frequencies within a wide total spectrum. The rate at which the offset voltage in analog-to-digital converter 216 drifts may be slower than the slowest information-carrying frequency in input signal 222. In one embodiment, the time constant of feedback element 220 may be selected to be shorter than the period of the offset drift and longer than the period of the slowest information-carrying frequency in input signal 222. In a particular embodiment, the time constant of feedback element 220 is at least one hundred times longer than the period of the slowest information-carrying frequency in input signal 222. Other embodiments of feedback element 220 may be used without departing from the scope of the present invention.

Buffer 208 is coupled to quantizer 202 and feedback element 220. Buffer 208 receives the digital output signal 224 generated by quantizer 202 and forwards the digital output signal 224 to feedback element 220. Buffer 208 also buffers the impedance of feedback element 220, preventing feedback element 220 from interfering with the digital output signal 224 generated by quantizer 202. Buffer 208 may comprise any hardware, software, firmware, or combination thereof operable to buffer feedback element 220 and reduce or eliminate interference from feedback element 220.

FIG. 4 is a block diagram illustrating an exemplary multiple-bit analog-to-digital converter 316 constructed according to the teachings of the present invention. Analog-to-digital converter 316 may be suitable for use in system 10 of FIG. 1. In the illustrated embodiment, analog-to-digital converter 316 includes a differential amplifier 300, a N-bit quantizer 302, and a feedback element 320. Other embodiments of analog-to-digital converter 316 may be used without departing from the scope of the present invention.

Differential amplifier 300 may be the same or similar to differential amplifier 100 of FIG. 2. Quantizer 302 receives a signal 304 from differential amplifier 300. Quantizer 302 also generates a digital output signal 324 containing multiple-bit digital values that represent signal 304. Quantizer 302 may sample signal 304 generated by differential amplifier 300 under the control of a clock signal 306. Quantizer 302 may comprise any hardware, software, firmware, or combination thereof operable to receive a signal and generate multiple-bit digital representations of the signal. In one embodiment, quantizer 302 is operable to generate an eight-bit digital word during each sample of the signal 304 generated by differential amplifier 300.

In the illustrated embodiment, feedback element 320 includes a digital averager 308 and a filter 310. Digital averager 308 is coupled to quantizer 302 and filter 310. Digital averager 308 receives the N-bit digital values in digital output signal 324 from quantizer 302. Digital averager 308 also generates M-bit digital averages of the N-bit digital values in digital output signal 324. In addition, digital averager 308 communicates the most significant bit of the M-bit digital averages to filter 310. Digital averager 308 may comprise any hardware, software, firmware, or combination thereof operable to receive N-bit digital values and generate M-bit averages of the digital values. In one embodiment, digital averager 308 comprises a digital signal processor. One embodiment of a digital averager is illustrated in FIG. 5, which is described below.

Filter 310 is coupled to digital averager 308 and differential amplifier 300. Filter 310 may be the same or similar to feedback element 220 of FIG. 3. Filter 310 receives the most significant bit of the M-bit digital averages produced by digital averager 308. Filter 310 also generates a reference signal 328 based on the most significant bit of the M-bit digital averages produced by digital averager 308. In the illustrated embodiment, filter 310 includes a resistor 330 and a capacitor 332 coupled in series with resistor 330 and to a ground 334. The reference signal 328 communicated to differential amplifier 300 is generated at a point 336 between resistor 330 and capacitor 332.

Figure 5:
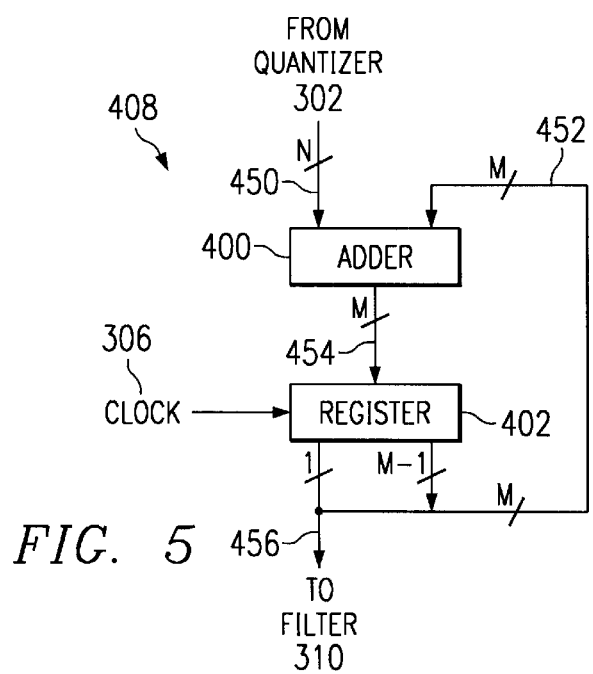
FIG. 5 is a block diagram illustrating an exemplary digital averager constructed according to the teachings of the present invention.

FIG. 5 is a block diagram illustrating an exemplary digital averager 408 constructed according to the teachings of the present invention. Digital averager 408 may be suitable for use in analog-to-digital converter 316 of FIG. 4. In the illustrated embodiment, digital averager 408 includes an adder 400 and a register 402.

Adder 400 is coupled to quantizer 302 and register 402. Adder 400 receives a first input signal 450 from quantizer 302 and a second input signal 452 from register 402. First input signal 450 contains an N-bit digital value produced by quantizer 302 in digital output signal 324. Second input signal 452 contains the previous M-bit digital average produced by digital averager 408. Adder 400 is operable to add the N-bit digital value in signal 450 and the M-bit digital value in signal 452, generating an M-bit digital value in an output signal 454. Adder 400 communicates the digital value to register 402. Adder 400 may comprise any hardware, software, firmware, or combination thereof operable to add digital values. In one embodiment, adder 400 adds N-bit digital values and M-bit digital values, where M>N.

Register 402 is coupled to adder 400 and filter 310. Register 402 is operable to receive and store an M-bit digital value generated by adder 400. In one embodiment, register 402 stores digital values under the control of clock 306, which synchronizes register 402 and quantizer 302. In addition, register 402 communicates the most significant bit 456 of the M-bit digital value to filter 310, and register 402 communicates the M-bit digital value to adder 400 as signal 452. Register 402 may comprise any hardware, software, firmware, or combination thereof operable to receive and store digital values. In one embodiment, register 402 comprises a clocked parallel digital register.

FIG. 6 is a block diagram illustrating another exemplary multiple-bit analog-to-digital converter 416 constructed according to the teachings of the present invention. Analog-to-digital converter 416 may be suitable for use in system 10 of FIG. 1. In the illustrated embodiment, analog-to-digital converter 416 includes a differential amplifier 500, a N-bit quantizer 502, and a feedback element 520. Other embodiments of analog-to-digital converter 416 may be used without departing from the scope of the present invention.

Differential amplifier 500 and quantizer 502 may be the same or similar to differential amplifier 300 and quantizer 302, respectively, of FIG. 4. Also, in the illustrated embodiment, feedback element 520 includes a digital averager 508, a P-bit digital-to-analog converter (DAC) 512, and a filter 510. Filter 510 may be the same or similar to filter 310 of FIG. 4.

Digital averager 508 is coupled to quantizer 502 and digital-to-analog converter 512. Digital averager 508 receives the N-bit digital values in digital output signal 524 from quantizer 502. Digital averager 508 also generates M-bit digital averages of the N-bit digital values in digital output signal 524. In addition, digital averager 508 communicates one or more of the most significant bits of the M-bit digital averages to digital-to-analog converter 512. Digital averager 508 may comprise any hardware, software, firmware, or combination thereof operable to receive N-bit digital values and generate M-bit averages of the digital values. In one embodiment, digital averager 508 comprises a digital signal processor. One embodiment of a digital averager is illustrated in FIG. 7, which is described below.

Digital-to-analog converter 512 is coupled to digital averager 508 and filter 510. Digital-to-analog converter 512 receives one or more of the most significant bits of the M-bit digital averages generated by digital averager 508. Digital-to-analog converter 512 also converts the P-most-significant-bits of the M-bit digital averages into an analog signal. When digital averager 508 operates under the control of clock 506, digital-to-analog converter 512 may receive and convert a P-bit signal from digital averager 508 during each clock cycle. Digital-to-analog converter 512 may comprise any hardware, software, firmware, or combination thereof operable to convert P-bit digital signals into analog signals. In one embodiment, digital-to-analog converter 512 has a bipolar output centered about the expected average value of the input signal 522. In a particular embodiment, digital-to-analog converter 512 has a bipolar output centered about zero volts when the input signal 522 is sinusoidal.

Filter 510 receives an analog signal from digital-to-analog converter 512, and the analog signal represents the P-most-significant-bits of the M-bit digital averages produced by digital averager 508. Filter 510 also generates a reference signal 528 based on the P-most-significant-bits of the M-bit digital averages produced by digital averager 508. In the illustrated embodiment, filter 510 includes a resistor 530 and a capacitor 532 coupled in series with resistor 530 and to a ground 534. The reference signal 528 communicated to differential amplifier 500 is generated at a point 536 between resistor 530 and capacitor 532.

In this embodiment, the time constant of feedback element 520 is determined by the time constant of digital averager 508 and the time constant of filter 510. The time constant of digital averager 508 may be defined using the formula:

$$\text{Time constant} \approx 2^M / F_{clock}$$

where M represents the number of bits in the digital averages produced by digital averager 508, and $F_{clock}$ represents the frequency of clock 506. The time constant of digital averager 508 and the time constant of filter 510 may be varied independently to achieve the desired characteristics of feedback element 520.

In one embodiment, the time constant of digital averager 508 may be much greater than the time constant of filter 510. In this embodiment, the time constant of digital averager 508 establishes the overall time constant of feedback element 520. In a particular embodiment, the time constant of filter 510 may be selected to filter high frequency noise associated with changes in the state of the digital-to-analog converter 512. For example, the time constant of filter 510 may be defined using the formula:

$$\text{Time constant} = 1/F_{clock}$$

where $F_{clock}$ represents the frequency of clock 506. In this embodiment, fast transients associated with changes in the state of digital-to-analog converter 512 may be filtered out of reference signal 528.

FIG. 7 is a block diagram illustrating another exemplary digital averager 608 constructed according to the teachings of the present invention. Digital averager 608 may be suitable for use in analog-to-digital converter 516 of FIG. 6. In the illustrated embodiment, digital averager 608 includes an adder 600 and a register 602.

Adder 600 may be the same or similar to adder 400 of FIG. 5. Register 602 is coupled to adder 600 and filter 510. Register 602 is operable to receive and store the M-bit digital values generated by adder 600. Register 602 communicates the P-most-significant-bits 656 of the M-bit digital value to filter 510, and register 602 communicates the M-bit digital value to adder 600 as signal 652. Register 602 may comprise any hardware, software, firmware, or combination thereof operable to receive and store digital values. In one embodiment, register 602 comprises a clocked parallel digital register.

FIG. 8 is a flowchart illustrating an exemplary method 800 for sampling an input signal according to the teachings of the present invention. Although method 800 is described as it relates to analog-to-digital converter 116, the same or similar method may be used by analog-to-digital converters 16, 216, 316, and/or 416.

Analog-to-digital converter 116 receives an input signal at step 802. This may include, for example, differential amplifier 100 of analog-to-digital converter 116 receiving the input signal 122 from receiver 12 and/or amplifier 14. Analog-to-digital converter 116 offsets the input signal with a reference signal at step 804. This may include, for example, differential amplifier 100 receiving the reference signal 128 from feedback element 120, where the reference signal 128 comprises a voltage signal representing the average of the previous digital values produced by quantizer 102. This may also include differential amplifier 100 producing a signal 104, which represents the difference between the input signal 122 and the reference signal 128. Analog-to-digital converter 116 generates a digital output signal at step 806. This may include, for example, differential amplifier 100 communicating signal 104 to quantizer 102. When the signal 104 is positive, quantizer 102 may generate a high digital value in digital output signal 124. When the signal 104 is negative, quantizer 102 may generate a low digital value in digital output signal 124.

At or near the time that analog-to-digital converter 116 is sampling the input signal, analog-to-digital converter 116 adjusts the reference signal at step 808. This may include, for example, feedback element 120 receiving the digital output signal 124. This may also include feedback element 120 generating reference signal 128 based on the digital values in output signal 124. For example, if digital output signal 124 contains more high values than low values, feedback element 120 may generate a positive reference signal 128. Similarly, if digital output signal 124 contains more low values than high values, feedback element 120 may generate a negative reference signal 128. When the number of high and low values in digital output signal 124 are equal, feedback element 120 may generate a reference signal 128 of zero volts. Feedback element 120 communicates the adjusted reference signal 128 at step 810. This may include, for example, feedback element 120 providing the reference signal to differential amplifier 100. Analog-to-digital converter 116 may then use the adjusted reference signal 128 to generate additional digital values in digital output signal 124.

By adjusting the reference signal 128 used by analog-to-digital converter 116 to generate the digital output signal 124, the long-term average of the digital values in digital output signal 124 may remain constant or relatively constant. This helps to reduce or eliminate the formation of an offset voltage in analog-to-digital converter 116. As a result, the sensitivity of analog-to-digital converter 116 may increase, allowing analog-to-digital converter 116 to more accurately sample input signal 122. The increased sensitivity of analog-to-digital converter 116 also increases the effective range of analog-to-digital converter 116. Analog-to-digital converter 116 may effectively sample input signals 122 at greater distances from the source of input signals 122.

In addition, the greater sensitivity of analog-to-digital converter 116 helps to increase the signal-to-noise power ratio of converter 116. Analog-to-digital converter 116 may generate a digital output signal 124 that contains less noise than conventional analog-to-digital converters.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. An analog-to-digital converter for sampling an input signal, comprising:

a differential amplifier operable to receive the input signal and a reference signal and to offset the input signal with the reference signal, the reference signal representing an offset voltage in the analog-to-digital converter;

a quantizer coupled to the differential amplifier, the quantizer operable to receive the offset input signal and to generate a digital output signal based on the offset input signal; and a feedback element coupled to the quantizer and to the differential amplifier, the feedback element operable to adjust the reference signal based on the digital output signal and to communicate the adjusted reference signal to the differential amplifier, the adjusted reference signal based at least partially on an average of digital values contained in the digital output signal.

2. The analog-to-digital converter of claim 1, wherein the feedback element comprises a filter operable to receive the digital output signal and generate a direct current voltage signal based on the digital output signal, the reference signal comprising the voltage signal.

3. The analog-to-digital converter of claim 2, wherein the filter has a time constant that is at least one hundred times longer than a period of a frequency at which information is carried in the input signal.

4. The analog-to-digital converter of claim 1, wherein the quantizer is operable to generate digital values comprising a plurality of bits, the digital output signal comprising the digital values.

5. The analog-to-digital converter of claim 4, wherein the feedback element comprises:

a digital averager coupled to the quantizer, the digital averager operable to receive the digital values in the digital output signal and to determine digital averages of the digital values; and a filter coupled to the digital averager and to the differential amplifier, the filter operable to receive at least one bit of the digital averages and to generate a direct current voltage signal based on the at least one bit of the digital averages, the reference signal comprising the voltage signal.

6. The analog-to-digital converter of claim 4, wherein the feedback element comprises:

a digital averager coupled to the quantizer, the digital averager operable to receive the digital values in the digital output signal and to determine digital averages of the digital values;

a digital-to-analog converter coupled to the digital averager and operable to receive one or more bits of the digital averages, the digital-to-analog converter also operable to generate an analog signal based on the one or more bits of the digital averages; and a filter coupled to the digital-to-analog converter and to the differential amplifier, the filter operable to receive the analog signal from the digital-to-analog converter and to generate a direct current voltage signal based on the analog signal, the reference signal comprising the voltage signal.

7. An antenna, comprising:

at least one receiver operable to receive an input signal;

a plurality of analog-to-digital converters coupled to the at least one receiver, the analog-to-digital converters operable to convert the input signal into digital output signals, at least one of the analog-to-digital converters comprising a feedback element operable to adjust a reference signal based on the digital output signal, the reference signal representing an offset voltage in the analog-to-digital converter, the at least one analog-to-digital converter operable to convert the input signal into the digital output signal using the reference signal, the reference signal based at least partially on an average of digital values contained in the digital output signal; and a digital accumulator coupled to the analog-to-digital converters, the digital accumulator operable to receive the digital output signals from the analog-to-digital converters and to generate a net digital output signal comprising a sum of the digital output signals.

8. The antenna of claim 7, wherein the feedback element comprises a filter operable to receive the digital output signal and generate a direct current voltage signal based on the digital output signal, the reference signal comprising the voltage signal.

9. The antenna of claim 8, wherein the filter has a time constant that is at least one hundred times longer than a period of a frequency at which information is carried in the input signal.

10. The antenna of claim 7, wherein the digital output signal comprises digital values comprising a plurality of bits.

11. The antenna of claim 10, wherein the feedback element comprises:

a digital averager operable to receive the digital values in the digital output signal and to determine digital averages of the digital values; and a filter coupled to the digital averager, the filter operable to receive at least one bit of the digital averages and to generate a direct current voltage signal based on the at least one bit of the digital averages, the reference signal comprising the voltage signal.

12. The antenna of claim 10, wherein the feedback element comprises:

a digital averager operable to receive the digital values in the digital output signal and to determine digital averages of the digital values;

a digital-to-analog converter coupled to the digital averager and operable to receive one or more bits of the digital averages, the digital-to-analog converter also operable to generate an analog signal based on the one or more bits of the digital averages; and a filter coupled to the digital-to-analog converter, the filter operable to receive the analog signal from the digital-to-analog converter and to generate a direct current voltage signal based on the analog signal, the reference signal comprising the voltage signal.

13. The antenna of claim 7, wherein at least one analog-to-digital converter further comprises:

a differential amplifier operable to receive the input signal and the reference signal and to offset the input signal with the reference signal; and a quantizer coupled to the differential amplifier, the quantizer operable to receive the offset input signal and to generate the digital output signal based on the offset input signal.

14. The antenna of claim 7, further comprising at least one amplifier coupled to the receiver, the amplifier operable to receive and amplify the input signal.

15. A method for sampling an input signal, comprising:

offsetting the input signal with a reference signal, the reference signal representing an offset voltage in the analog-to-digital converter;

generating a digital output signal based on the offset input signal;

adjusting the reference signal based on the digital output signal, the adjusted reference signal based at least partially on an average of digital values contained in the digital output signal; and communicating the adjusted reference signal for further offsetting of the input signal.

16. The method of claim 15, wherein adjusting the reference signal based on the digital output signal comprises generating a voltage signal using a filter, the voltage signal based on the digital output signal.

17. The method of claim 16, wherein the filter has a time constant that is at least one hundred times longer than a period of a frequency at which information is carried in the input signal.

18. The method of claim 15, wherein generating a digital output signal comprises generating digital values comprising a plurality of bits.

19. The method of claim 18, wherein adjusting the reference signal based on the digital output signal comprises:

determining digital averages of the digital values in the digital output signal; and generating a voltage signal based on at least one of the bits of the digital averages, the reference signal comprising the voltage signal.

20. The method of claim 18, wherein adjusting the reference signal based on the digital output signal comprises:

determining digital averages of the digital values in the digital output signal;

converting one or more bits of the digital averages into an analog signal; and generating a voltage signal based on the analog signal, the reference signal comprising the voltage signal.

* * * * *